(12) United States Patent
Behr et al.

(10) Patent No.: US 10,204,880 B2
(45) Date of Patent: Feb. 12, 2019

(54) DEVICE AND METHOD FOR PRODUCING A DEVICE

(71) Applicant: OSRAM Opto Semiconductors GmbH, Regensburg (DE)

(72) Inventors: Barbara Behr, Abensberg (DE); Mathias Wendt, Hausen (DE); Marcus Zenger, Hausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/754,872

(22) PCT Filed: Aug. 23, 2016

(86) PCT No.: PCT/EP2016/069890
§ 371 (c)(1),
(2) Date: Feb. 23, 2018

(87) PCT Pub. No.: WO2017/032771
PCT Pub. Date: Mar. 2, 2017

(65) Prior Publication Data
US 2018/0261564 A1 Sep. 13, 2018

(30) Foreign Application Priority Data
Aug. 25, 2015 (DE) .......................... 10 2015 114 086

(51) Int. Cl.
*H01L 23/485* (2006.01)
*H01L 23/00* (2006.01)
(Continued)

(52) U.S. Cl.
CPC ........ *H01L 24/29* (2013.01); *H01L 23/53223* (2013.01); *H01L 23/53238* (2013.01);
(Continued)

(58) Field of Classification Search
None
See application file for complete search history.

(56) References Cited

U.S. PATENT DOCUMENTS

| 8,951,837 B2 * | 2/2015 | Chen | H01L 24/29 257/E21.088 |
| 2012/0306105 A1 | 12/2012 | Robert | |

(Continued)

FOREIGN PATENT DOCUMENTS

| EP | 1684340 A2 | 7/2006 |
| EP | 2993692 A2 | 3/2016 |

(Continued)

OTHER PUBLICATIONS

Jellison, J. E., "Gold-Indium Intermetallic Compounds: Properties and Growth Rates," Materials Control and Applications Branch, Nov. 8, 1979, 45 pages.

(Continued)

Primary Examiner — Minh-Loan Tran
(74) Attorney, Agent, or Firm — Slater Matsil, LLP (57) ABSTRACT

A device and a method for producing a device are disclosed. In an embodiment the device includes a first component, a second component and a connecting element directly arranged between the first component and the second component, wherein the connecting element includes at least a first metal, which is formed as an adhesive layer, a diffusion barrier and a component of a first phase and a second phase of the connecting element, wherein the adhesive layer is arranged on the first component and/or the second component, wherein the first phase and/or the second phase includes, besides the first metal, further metals different from the first metal, wherein a concentration of the first metal in the first phase is greater than a concentration of the (Continued)

first metal in the second phase, and wherein the connecting element includes a layer of a silicide of the first metal.

16 Claims, 5 Drawing Sheets (51) Int. Cl.
 H01L 33/62 (2010.01)
 H01L 23/532 (2006.01)
 B23K 35/32 (2006.01)
 B23K 35/30 (2006.01)
(52) U.S. Cl.
 CPC .. *H01L 23/53252* (2013.01); *H01L 23/53266* (2013.01); *H01L 24/26* (2013.01); *H01L 24/32* (2013.01); *H01L 24/83* (2013.01); *H01L 33/62* (2013.01); *B23K 35/3033* (2013.01); *B23K 35/322* (2013.01); *H01L 2224/2908* (2013.01); *H01L 2224/29109* (2013.01); *H01L 2224/29111* (2013.01); *H01L 2224/29144* (2013.01); *H01L 2224/29155* (2013.01); *H01L 2224/29164* (2013.01); *H01L 2224/29169* (2013.01); *H01L 2224/83825* (2013.01); *H01L 2924/12041* (2013.01); *H01L 2933/0066* (2013.01)

(56) References Cited

U.S. PATENT DOCUMENTS

| | | |
|---|---|---|
| 2013/0270327 A1 | 10/2013 | Yoon |
| 2013/0334561 A1 | 12/2013 | Lin et al. |
| 2014/0077377 A1 | 3/2014 | Sasaki et al. |
| 2014/0137989 A1 | 5/2014 | Huang et al. |
| 2014/0273318 A1 | 9/2014 | Ryu et al. |
| 2016/0346857 A1 | 12/2016 | Behr et al. |

FOREIGN PATENT DOCUMENTS

| | | |
|---|---|---|
| JP | 2009049144 A | 3/2009 |
| WO | 9417551 A1 | 8/1994 |

OTHER PUBLICATIONS

Nicolet, M.A., "Diffusion Barriers in Thin Films," Elsevier Sequoia, Thin Solid Films, vol. 52, 1978, 15 pages.

* cited by examiner

DEVICE AND METHOD FOR PRODUCING A DEVICE

This patent application is a national phase filing under section 371 of PCT/EP2016/069890, filed Aug. 23, 2016, which claims the priority of German patent application 10 2015 114 086.1, filed Aug. 25, 2015, each of which is incorporated herein by reference in its entirety.

TECHNICAL FIELD

The invention relates to a device. The invention further relates to a method for producing a device.

BACKGROUND

In the joining of two components, for example, of two wafers, a bonding layer and/or a diffusion barrier are usually present in addition to the connecting element. In particular the material of the connecting element is different from the material of the adhesive layers.

SUMMARY OF THE INVENTION

Embodiments of the invention provide a device which has a simple structure. In particular, the device comprises a first metal, which is formed as an adhesive layer, as a diffusion barrier and as a part of a first and second phase of the connecting element, that is to say as a solder metal. In particular, the device has no additional adhesive layers and/or no additional diffusion barriers.

Further embodiments provide a method for producing a device which can be carried out easily and/or cost-effectively.

In at least one embodiment, the device comprises a first component, a second component and a connecting element. In particular, the device consists of a first component, a second component and a connecting element. The connecting element is directly arranged, that is to say in direct mechanical and/or electrical contact, between the first component and the second component. The connecting element comprises at least one first metal. The first metal is formed as an adhesive layer. The adhesive layer is arranged on the first component and/or second component. In particular, the adhesive layer is arranged directly adjacent to the first component and/or second component. The first metal is formed as a diffusion barrier. The first metal is part of a first phase and/or a second phase of the connecting element. The first and/or second phase comprises further metals in addition to the first metal, which are different from the first metal. In particular, the concentration of the first metal in the first phase is greater than the concentration of the first metal in the second phase, if at least these two phases are present. In addition, more than two phases, for example, three, four or five phases, can be present.

In addition, the connecting element can comprise a layer of a silicide of the first metal, which is arranged between the adhesive layer and the first and/or second component.

According to at least one embodiment, the device comprises a first component and/or a second component. The first component and/or the second component may be selected from a different number of materials and elements. The first and/or second component can be selected, for example, from a group consisting of sapphire, silicon nitride, a semiconductor material, a ceramic material, a metal and glass.

For example, one of the two components is a semiconductor or ceramic wafer, for example, a shaped material made of sapphire, silicon, germanium, silicon nitride, aluminum oxide, a luminescent ceramic, such as, for example, YAG. It is also possible that at least one component is formed as a printed circuit board (PCB), a metallic lead frame or as another type of connecting support. Furthermore, at least one of the components can comprise, for example, an electronic chip, an optoelectronic chip, a light-emitting diode, a laser chip, a photo-detector chip or a wafer or a plurality of such chips. In particular, the first component and/or the second component is a light-emitting diode, abbreviated as LED.

The component comprising the light-emitting diode is preferably designed to emit blue light or white light. Alternatively, the component can emit other colors, for example, red, orange, green, or radiation from the IR region or of a laser.

The light-emitting diode comprises at least one optoelectronic semiconductor chip. The optoelectronic semiconductor chip can have a semiconductor layer sequence.

The semiconductor layer sequence of the semiconductor chip is preferably based on a III-V compound semiconductor material. For example, compounds from the elements comprising indium, gallium, aluminum, nitrogen, phosphorus, arsenic, oxygen, silicon, carbon and combinations thereof are used. However, other elements and additions can also be used. The semiconductor layer sequence having an active region can be based, for example, on nitride compound semiconductor materials. In the present context, "based on nitride compound semiconductor material" means that the semiconductor layer sequence or at least a part thereof comprises a nitride compound semiconductor material, preferably $Al_nGa_mIn_{1-n-m}N$ with $0 \leq n \leq 1$, $0 \leq m \leq 1$ and $n+m \leq 1$, or consists thereof. This material does not necessarily have a mathematically exact composition according to the above formula. Rather, it can have, for example, one or more dopants and additional constituents. For the sake of simplicity, however, the above formula only contains the essential constituents of the crystal lattice (Al, Ga, In, N), even if these can be partially replaced and/or supplemented by small quantities of further substances.

The semiconductor layer sequence comprises an active layer having at least one pn-junction and/or having one or more quantum well structures. During operation of the LED or of the semiconductor chip, an electromagnetic radiation is generated in the active layer. A wavelength or a wavelength maximum of the radiation is preferably in the ultraviolet and/or visible and/or infrared spectral range, in particular at wavelengths between 420 nm and 800 nm inclusive, for example, between 440 nm and 480 nm inclusive.

According to at least one embodiment, the device has a connecting element. The connecting element connects the first and the second component to one another.

According to at least one embodiment, the connecting element is a connecting layer or has a plurality of connecting layers.

For example, the connecting element can be a mechanical connection between the first component and the second component. Furthermore, an electrical connection of the first component to the second component can also be effected via the connecting element. In particular, the connecting element is arranged in direct mechanical and/or electrical contact, that is to say directly, to the first component and to the second component. The connecting element comprises at least one first metal.

The first metal can be formed as an adhesive layer, or the adhesive layer can comprise the first metal. The term "adhesive layer" is to be understood here and below as that the first metal is designed to connect the connecting element to at least the first component and/or the second component. The adhesive layer is arranged in particular in immediate, i.e., direct, mechanical and/or electrical contact on the first component and/or the second component. In other words, no further layers, in particular no further adhesive layers with the exception of the adhesive layer made of the first metal and/or no further diffusion barriers with the exception of the diffusion barrier made of the first metal, are arranged between the first component and the second component.

In other words, no further adhesive layers and/or barrier layers are used here. The production of the device can thus be simplified and the complexity of the device can be reduced.

According to at least one embodiment, the connecting element is free of the following elements in free or bonded form: titanium, tantalum, tungsten and/or nitrogen. For example, the connecting element does not have any titanium. In particular, the connecting element has no adhesive layer which consists of gold and/or titanium or comprises these materials.

In particular, the connecting element has no additional diffusion barrier which comprises or consists of tantalum and/or titanium.

In particular, no diffusion barrier layers and/or adhesive layers made of titanium compounds, such as titanium nitride, titanium tungsten, titanium tungsten nitride, tantalum compounds, such as tantalum nitride, and/or gold compounds are present in the device.

According to at least one embodiment, the connecting element has a layer made of a silicide of the first metal. In particular, the layer of the silicide of the first metal is arranged between the adhesive layer and the first and/or second component. For example, when bonding to silicon, the first metal can be nickel, so that the adhesive layer consists of or comprises nickel silicide ($Ni_xSi_y$).

The first metal of the connecting element can be formed as a diffusion barrier. As a result, the first metal prevents migration or diffusion of other species in spatial and temporal direction. In particular, the first metal as a diffusion barrier prevents that, for example, functional layers in a device, for example, an optoelectronic device, lose their specific properties during operation. The loss of such specific properties can lead, for example, to diffusion of other constituents into functional layers. This usually leads to degradation and, under some circumstances, even to failure of the device.

The first metal thus acts as a barrier and thus prevents or reduces the diffusion of undesired species, for example, tin, indium or silver, between the first and the second component.

According to at least one embodiment, the diffusion barrier is formed as a layer and is arranged directly downstream of the adhesive layer. Alternatively, the adhesive layer can function as a diffusion barrier. In other words, the adhesive layer is then also the diffusion barrier.

According to at least one embodiment, the first metal of the connecting element is part of a first phase and optionally of a second phase of the connecting element. In other words, the first phase and optionally the second phase comprises at least the first metal.

According to at least one embodiment, the first and/or second phase, in addition to the first metal, comprises further metals different from the first metal. For example, the first and/or second phase each have a second metal, a third metal and/or a fourth metal or consist thereof.

The connecting element can also have more than two phases, for example, three, four or five phases. The connecting element can also have a plurality of first phases and/or a plurality of second phases. In particular, a plurality of first phases are spatially separated from one another. For example, two first phases can be spatially separated from one another by a second phase. The at least one first phase and/or the at least one second phase differ at least in terms of their composition. If, for example, the connecting element consists of three phases, two identical first phases and the second phase can be present.

In this case, "phase" means a region of the connecting element in which the material has a similar or identical composition and thus has similar or identical physical properties, for example, a similar or the same melting temperature.

According to at least one embodiment, the respective phases of the connecting element have different types of metals. In particular, the metals differ from one another within the corresponding phases. For example, the connecting element has at least three or four different metals in different concentrations in the first phase. In particular, the first phase comprises a first metal Me1 having a concentration $c11$, a second metal Me2 having a concentration $c12$, a third metal Me3 having a concentration $c13$ and optionally a fourth metal Me4 having a concentration $c14$. In particular, the first phase consists of these three or four mentioned metals. The second phase can likewise comprise or consist of different types of metals. For example, the second phase can contain the same first metal Me1 as contained in the first phase and having a concentration $c25$, the same second metal Me2 as contained in the first phase and having a concentration $c26$, and the same third metal Me3 as contained in the first phase and having a concentration $c27$. Alternatively or additionally, further metals, for example, a fourth metal Me4 having a concentration $c28$, can also be present in the second phase. In particular, the first metal Me1 of the first phase differs from the first metal Me1 of the second phase by its concentration within the corresponding phases. In particular, the concentration $c11$ of the first metal Me1 in the first phase is greater than the concentration $c25$ of the first metal Me1 in the second phase. In particular, the corresponding metals form an alloy in the corresponding phases.

According to at least one embodiment, the first metal is selected from a group consisting of nickel, platinum and palladium. The first metal is preferably nickel, which can be made available at low cost. In particular, alternatively or additionally, the concentration of the first metal Me1 in the diffusion barrier is greater than the concentration of the first metal in the first phase.

According to at least one embodiment, the component has a layer sequence: first component, adhesive layer, first phase, second phase, second component. In particular, the concentration of the first metal in the adhesive layer is greater than the concentration of the first metal in the first phase and greater than the concentration of the first metal in the second phase. In other words, the concentration of the first metal thus decreases from the adhesive layer in the direction of the second phase.

Alternatively, the component has a layer sequence: first component, adhesive layer, diffusion barrier, first phase, second phase, first phase, adhesive layer, diffusion barrier, second component. Alternatively, the adhesive layer can fulfil the function of the diffusion barrier, so that no separate diffusion barrier is present. In particular, the concentration of the first metal in the adhesive layers is greater than the concentration of the first metal in the first phase and greater than the concentration of the first metal in the second phase. In other words, the concentration of the first metal thus decreases from the first and/or the second component in the direction of the second phase.

According to at least one embodiment, the first and/or second phase is in each case formed as a layer. In particular, the adhesive layer and the layers of the first and/or the second phases are stacked one on top of the other. The adhesive layer has a layer thickness d2. In particular, the layer thickness d2 of the adhesive layer is smaller by a factor of 2 than the sum of the layer thicknesses of the first and second phases.

The adhesive layer can have a layer thickness of 5 nm to 50 nm. The first and/or second phases can each have a layer thickness of 50 nm to 100 nm.

According to at least one embodiment, the second metal is indium and/or the third metal is tin.

According to at least one embodiment, the further metals comprise at least one fourth metal Me4. In particular, the fourth metal is gold. In particular, the first and/or second phase each has a system of NiInSn, AuInSn, NiSn, NiIn and/or PtSn.

According to at least one embodiment, the concentration c11 of the first metal in the first phase is between 40 atom % and 65 atom % inclusive, in particular between 45 atom % and 60 atom % inclusive, for example, 50 atom %. Alternatively or additionally, the concentration c25 of the first metal in the second phase is between 20 atom % inclusive and 40 atom % inclusive, in particular between 25 atom % and 35 atom %, for example, 30 atom %.

According to at least one embodiment, the concentration c11 of the first metal in the first phase is between 8 atom % and 30 atom % inclusive, in particular between 11 atom % and 25 atom % inclusive, for example, 20 atom %. Alternatively or additionally, the concentration c25 of the first metal in the second phase is 0 atom %. In other words, the second phase does not have or comprise the first metal.

According to at least one embodiment, the concentration c12 of the second metal in the first phase is between 5 atom % and 25 atom % inclusive, in particular between 8 atom % and 20 atom % inclusive, for example, is atom %. Alternatively or additionally, the concentration c26 of the second metal in the second phase is between 15 or 20 atom % inclusive and 40 atom % inclusive, in particular between 20 atom % and 35 atom %, for example, 25 atom %.

According to at least one embodiment, the concentration c12 of the second metal in the first phase is between 0 and 10 atom %, in particular between 0 and 7 atom %, for example, 3 atom %. The concentration c12 of the second metal in the first phase can be 0 atom %, i.e., no second metal is present in the first phase. Alternatively or additionally, the concentration c26 of the second metal in the second phase is between 8 atom % and 35 atom % inclusive, in particular between 13 atom % and 29 atom % inclusive, for example, 20 atom %.

According to at least one embodiment, the concentration c13 of the third metal in the first phase is between 15 atom % and 45 atom % inclusive, in particular between 15 or 20 atom % and 40 atom % inclusive, for example, 30 atom %. Alternatively or additionally, the concentration c27 of the third metal in the second phase is between 25 or 30 atom % inclusive and so atom % inclusive, in particular between 30 atom % and 45 atom %, for example, 35 atom %.

According to at least one embodiment, the concentration c13 of the third metal in the first phase is between 35 atom % and 55 atom % inclusive, in particular between 41 atom % and 50 atom % inclusive, for example, 45 atom %. Alternatively or additionally, the concentration c27 of the third metal in the second phase is between 0 and 15 atom %, in particular between 0 and 10 atom %, for example, 5 atom %. The concentration of the third metal in the second phase can be 0 atom %, which would mean that the third metal is not present in the second phase of the connecting element.

According to at least one embodiment, the concentration c14 of the fourth metal in the first phase and/or the second phase is between 0 and 5 atom %, for example, 3 atom %. The fourth metal cannot be present in the first and/or second phase of the connecting element, that is to say have a concentration of 0 atom %. Alternatively, the concentration c14 of the fourth metal in the first phase can be between 25 atom % and 45 atom % inclusive, in particular between 28 atom % and 40 atom % inclusive, for example, 30 atom %. Alternatively or additionally, the concentration c28 of the fourth metal in the second phase can be between 65 atom % and 88 atom %, in particular between 71 atom % and 83 atom % inclusive, for example, 80 atom %.

The concentrations were determined by means of EDX (Energy dispersive x-ray spectroscopy), which can have an error tolerance of at most 5%, in particular a maximum of 2%.

In particular, the concentrations of the first metal in the first phase can be combined with the concentrations of the second metal in the first phase and with the concentration of the third metal in the first phase and optionally with the concentration of the fourth metal in the first phase. In particular, the concentration of the first metal in the second phase can be arbitrarily combined with the concentration of the second metal in the second phase and with the concentration of the third metal in the second phase and optionally with the concentration of the fourth metal in the second phase.

According to at least one embodiment, the connecting element comprises a first metal made of nickel, palladium or platinum, a second metal made of indium and a third metal made of tin in the first and/or second phase.

According to at least one embodiment, the connecting element comprises a first metal made of nickel, palladium or platinum, a second metal made of indium, a third metal made of tin and a fourth metal made of gold in the first and/or second phase.

According to at least one embodiment, the first metal, the second metal and the third metal are suitable for mixing at a processing temperature of <200° C., in particular of less than 180° C. This can be achieved, for example, in that the second metal and the third metal transform at a processing temperature of <200° C. or <120° C. to the liquid aggregate state and react with a solid first metal. This results in a first phase and/or a second phase which has a different concentration composition of the corresponding metals.

The inventors have recognized that the first metal has a plurality of functions such as adhesion, diffusion barrier and component of the first and second phases for a solder system. Further adhesive layers and/or diffusion barriers made of other materials are therefore not required.

In particular, the layers contained in the solder system are optimized in relation to their thickness and property, in such a way that the outer layers of the solder metal stack of this task are already satisfied. It is thus possible to avoid dedicated adhesive layers and diffusion barriers, which reduces the process steps for producing the devices, in particular thin-film LEDs, and thus reduces the complexity of the device.

The thicknesses of the individual layers, in particular the layer thickness of the adhesive layer, may be selected in such a way that a closed sufficiently thick layer made of a first metal, in particular the adhesive layer, remains after the complete reaction of the first and second phases in the joining process, that is to say of the solder. The formed phases are sufficiently thermodynamically and mechanically stable. In particular, after formation of the first and second phases, the adhesive layer has a sufficient residual thickness in order to maintain its function as an adhesive layer and/or diffusion barrier. In addition, the layer made of the first metal can be applied in such a way that it has a stress state which is favourable for the respective application. The adhesive layer made of the first metal can be a sacrificial layer or connection-forming barrier, which is a component of the solder system.

According to at least one embodiment, the surface of the first phase layer and/or of the second phase layer and/or of the adhesive layer is shaped in a wave shape. In particular, the adjoining surfaces of the first and/or second phase layer and/or of the adhesive layer are wave-shaped. In other words, the surface of the respective layer is not planar, but the layers mesh with one another due to their wave-shaped form. The wave-shaped form can be produced in particular by grains of different sizes.

The invention further relates to a method for producing a device. The method for producing the device preferably produces the device. This means that all the features disclosed for the method are also disclosed for the device and vice versa.

According to at least one embodiment, the method comprises the following steps:

A) providing a first component and a second component,

B) applying at least one adhesive layer made of a first metal having a layer thickness d1 on the first and/or second component. Additionally applying at least one layer of a second metal and at least one layer of a third metal onto the adhesive layer, wherein the first and/or second and/or third metals are different from each other. Alternatively, a layer made of a fourth metal can also be applied. The layer of the fourth metal can be arranged in particular between the layer made of the first metal and the layer made of the second metal.

C) heating the arrangement generated in step B) to a first temperature between 130° C. and 200° C. in order to form a first phase and a second phase, wherein the first and second phases are formed from the first metal of the adhesive layer, the second metal and the third metal and optionally the fourth metal.

D) heating the arrangement generated in step C) to a second temperature between 230° C. and 400° C. for forming a thermodynamically and mechanically stable first and second phase, wherein at least before step D) the first and second components are connected to one another, wherein the device after step D) has an adhesive layer with a first layer thickness d2<d1, wherein the adhesive layer generated after step D) is adhesively and diffusion-tight, and wherein the adhesive layer is arranged between the first phase and the first component and/or the first phase and the second component. In particular, the components are brought into contact with one another such that the applied layers lie directly on top of one another. In particular, the adhesive layer generated in step B) and made of the first metal is already diffusion-proof. In other words, step D) is not necessary in order to make the layer diffusion-proof.

The term "thermodynamically and mechanically stable" is understood here and below as that the first metal has completely reacted with the second metal and the third metal and/or is completely mixed, so that the first and/or second phase has a solid state of aggregation. In particular, after step D) the first and/or the second phase have a melting temperature which differs from the melting temperature of the first and/or second phase before step D), for example, in the first and second phases in step C). In particular, the remelting temperature of the first and/or second phase after step D) is greater than the remelting temperature of the first and/or second phase before step D), for example, in step C).

According to at least one embodiment, the connecting element forms at least in step C) a fixed connection to the first component and the second component.

According to at least one embodiment, a further step C1 is carried out between steps C) and D):

C1) cooling the arrangement generated in step C) to room temperature. A temperature of 25° C. is understood here in particular when referring to room temperature.

According to at least one embodiment, a layer made of a fourth metal is additionally applied in step B), which is part of the first and/or second phase at least in step C), wherein after step D) the adhesive layer with the layer thickness d2 and then the first phase and then the second phase are arranged downstream of the first and/or second component of the device.

In other words, the method enables the connection of a first component to a second component by means of a connecting element. In this case, the connecting element has both the function of adhesion, of the diffusion barrier and of a solder system. The term "solder system" is understood here and below in such a way that, in particular, the second and the third metal mix at a low processing temperature of <200° C. and react with the first metal. In this case, they form a fixed connection of a first phase and a second phase, wherein the concentrations of the first and second phases of the corresponding metals are different from one another. Subsequently, the phases can be heated in a second temperature step so that these phases are thermodynamically stable. In particular, the device has the adhesive layer at the interface between the diffusion barrier and the component.

According to at least one embodiment of the method, the first and/or second component is heated up to a first temperature, for example, up to a first temperature of at most 200° C. or at most 180° C. The first metal and the second metal and the third metal form a ternary first and/or second phase. In particular, the second and the third metal melt on account of their suitability for forming a eutectic and react with the first metal to form a ternary first and/or second phase. The ternary first or second phase comprises or consists of the first, second and third metals. The ternary phase can be a multi-phase intermetallic layer. In the device, these ternary phases then connect the first and second components to one another. In particular, the components have different coefficients of thermal expansion.

BRIEF DESCRIPTION OF THE DRAWINGS

Further advantages, advantageous embodiments and developments will become apparent from the exemplary embodiments described below in conjunction with the figures.

The figures show.

In the exemplary embodiments and figures, identical or identically acting elements can in each case be provided with the same reference symbols. The elements illustrated and their size relationships among one another are not to be regarded as true to scale. Rather, individual elements such as, for example, layers, components, devices and regions are represented with an exaggerated size for better representability and/or for a better understanding.

DETAILED DESCRIPTION OF ILLUSTRATIVE EMBODIMENTS

Figure 1A:
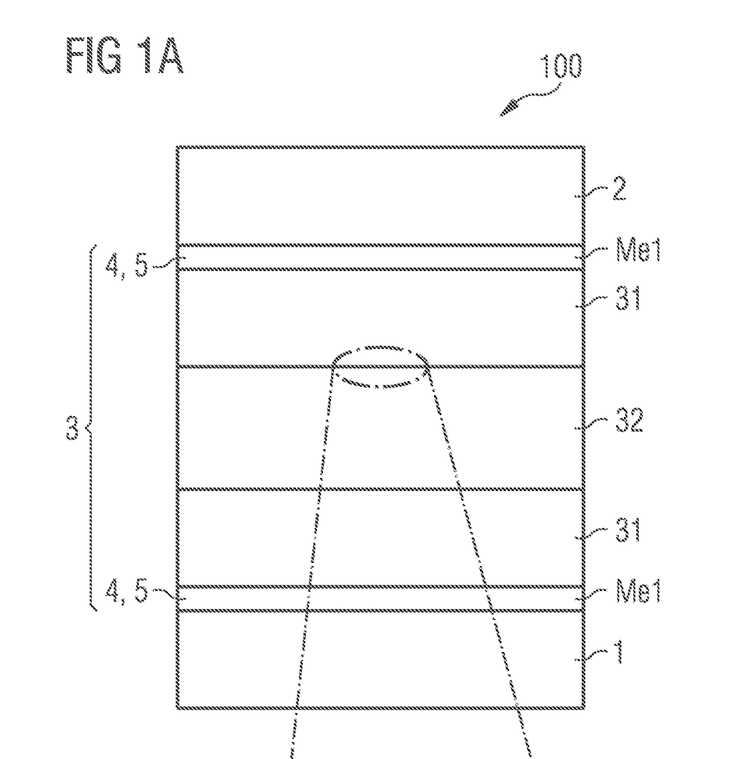
FIG. 1A shows a schematic side view of a device according to an embodiment.

FIG. 1 shows a schematic side view of a device according to an embodiment. The device 100 has a first component 1 and a second component 2. A connecting element 3 is arranged between the first component and the second component 1, 2. The connecting element 3 comprises or consists of a layer of a first metal Me1, a first phase 31 and a second phase 32, of a further first phase 31 and a further layer of the first metal Me1. In particular, the layer of the first metal Me1 forms the adhesive layer 4 and/or the further layer of the first metal Me1 forms the further adhesive layer 4. Alternatively, the layer of the first metal Me1 forms the adhesive layer 4 and the diffusion barrier 5 and/or the further layer of the first metal Me1 forms the further adhesive layer 4 and a further diffusion barrier 5. In particular, the layer of the first metal Me1, in particular the adhesive layer 4, is arranged directly on the first component 1 as well as on the second component 2. The first component 1 and the second component 2 are selected, for example, from a group consisting of sapphire, a ceramic material, a semiconductor material and a metal. In this case, the first component 1 and the second component 2 can be selected in such a way that they have different coefficients of thermal expansion. In particular, their coefficients of thermal expansion differ at least by a factor of 15, for example, by a factor of 3 or higher.

The connecting element 3 is arranged between the first component 1 and the second component 2, in particular in direct mechanical and/or electrical contact. The connecting element 3 comprises at least the layer Me1 as an adhesive layer 4, which can additionally be a diffusion barrier 5. In particular, the device 100 has two adhesive layers 4. The adhesive layers 4 are each arranged directly on the respective interface to the first and second components 1, 2.

The first phase 31 can consist of or comprise the following metals and the following concentrations thereof:

First metal Me1: 45 to 60 atom %,
Second metal Me2: 8 to 20 atom %,
Third metal Me3: 20 to 40 atom %,
Fourth metal Me4: 0 to 5 atom %.

The second phase 32 can consist of or comprise the following metals and their concentrations:

First metal Me1: 25 to 35 atom %,
Second metal Me2: 20 to 35 atom %,
Third metal Me3: 30 to 45 atom %,
Fourth metal Me4: 0 to 5 atom %.

The further first phase 31 can then consist of the following metals and their concentrations or comprise the same:

First metal Me1: 45 to 60 atom %,
Second metal Me2: 8 to 20 atom %,
Third metal Me3: 20 to 40 atom %,
Fourth metal Me4: 0 to 5 atom %.

Alternatively, for example, the first phase 31 can comprise or consist of the following metals and the following concentrations thereof:

First metal Me1: 11 to 24 atom %,
Second metal Me2: 0 to 7 atom %,
Third metal Me3: 42 to 50 atom %,
Fourth metal Me4: 29 to 40 atom %.

The second phase 32 can alternatively consist of or comprise the following metals and their concentrations:

First metal Me1: 0 atom %,
Second metal Me2: 13 to 22 atom %,
Third metal Me3: 3 to 10 atom %,
Fourth metal Me4: 71 to 83 atom %.

The further first phase 31 can alternatively consist of or comprise the following metals and their concentrations:

First metal Me1: 11 to 24 atom %,
Second metal Me2: 0 to 7 atom %,
Third metal Me3: 42 to 50 atom %,
Fourth metal Me4: 29 to 40 atom %.

The first metal Me1 can be nickel, platinum or palladium. The second metal Me2 can be indium. The third metal Me3 can be tin. The fourth metal Me4 can be gold.

In other words, the connecting element 3 has two first phases 31 and a second phase 32 arranged between the two first phases 31. The phases are arranged between two adhesive layers 4, which can be the diffusion barrier 5 at the same time. The first and second phases 31, 32 comprise at least three metals and optionally a further metal or consist thereof. In particular, the concentration of the first metal Me1 in the respective adhesive layer 4 is greater than the concentration c11 of the first metal Me1 in the first phase 31 and greater than the concentration c25 of the first metal Me1 in the second phase 32. In other words, the concentration of the first metal Me1 decreases from the first and/or second component 1, 2 in the direction of the second phase 32. The concentration of the first metal Me1 is greatest at the interface to the first and/or second component 1, 2. In this way, the respective adhesive layer 4 can have good adhesion with respect to the first and/or second component 1, 2. The remaining elementary Me1 between the adhesive layer 4 and the first phase 31 serves as a diffusion barrier.

In other words, the connecting element 3 has two first phases 31 and a second phase 32 arranged between the two first phases. The phases are arranged between two adhesive layers 4, which can also function as the diffusion barrier 5. The first and second phases 31, 32 comprise at least three metals and optionally a further metal or consist thereof. In particular, the concentration of the first metal Me1 in the respective adhesive layer 4 is greater than the concentration c11 of the first metal Me1 in the first phase 31 and greater than the concentration c25 of the first metal Me1 in the second phase 32. In other words, the concentration of the first metal Me1 of the first and/or second component 1, 2 decreases in the direction of the second phase 32. The concentration of the first metal Me1 is greatest at the interface to the first and/or second component 1, 2. In this way, the respective adhesive layer 4 can have good adhesion with respect to the first and/or second component 1, 2. The remaining elementary Me1 between the adhesive layer 4 and the first phase 31 serves as a diffusion barrier.

Figure 1B:
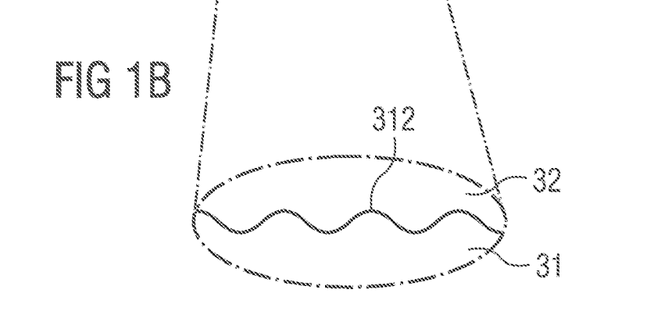
FIG. 1B shows a detailed view of FIG. 1A.

According to at least one embodiment, the adhesive layers 4, the first phase 31 and/or the second phase 32 are each formed as a layer. In particular, these layers are stacked one on top of the other. The interfaces between adjacent layers can be planar. Alternatively, as shown in FIG. 1B, the interfaces 312 between the first phase 31 and the second phase 32 are not planar but have a wave shape. As a result, the first phase 31 can be interlocked with the second phase 32. This leads to good adhesion between the two phases 31, 32.

In addition, the interface between the first phase 31 and the respective adhesive layer 4 can be wave-shaped. As a result, the first phase 31 can also be interlocked with the respective adhesive layer 4. As a result, a connecting element 3 can be provided which forms a strong connection between the first component 1 and the second component 2.

Figure 2A:
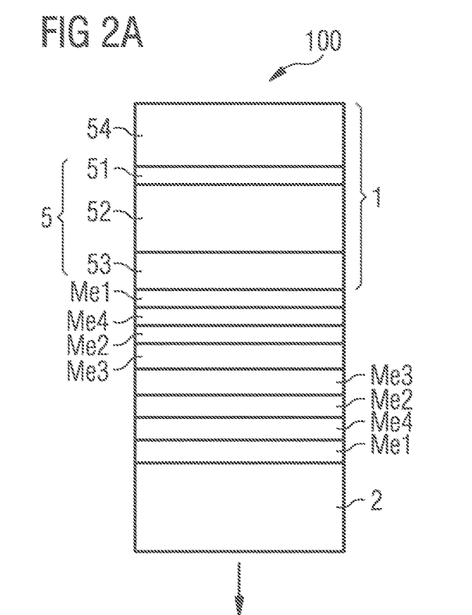
FIGS. 2A to 2B show schematic side views of a device according to an embodiment.
Figure 2B:
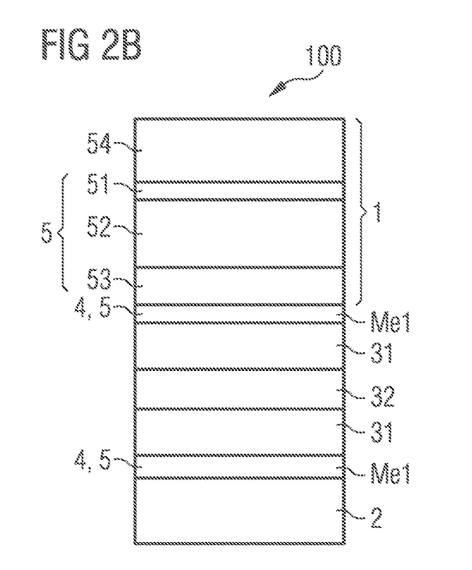

FIGS. 2A and 2B each show a device 100 according to an embodiment and the production thereof. FIG. 2A shows a device 100 before method steps C) and D), which means before being exposed to the influence of temperature. FIG. 2B shows the finished device 100 after at least method step C) and/or D).

FIG. 2A shows a first component 1, which consists of a layer sequence 52 to 54. The first component 1 has a substrate 54, which can be, for example, a sapphire substrate of a light-emitting diode. A semiconductor layer sequence 5 can be applied to the sapphire substrate 54. The semiconductor layer sequence 5 comprises an n-type semiconductor layer 51, an active layer 52 and a p-type semiconductor layer 53. Alternatively, the n-type semiconductor layer 51 and the p-type semiconductor layer 53 can be interchanged. In operation, the active layer 52 is designed to emit radiation in particular from the visible wavelength range. The semiconductor layer sequence can be grown, for example, using MOCVD processes.

The second component 2 can be, for example, a wafer made of an insulating ceramic material, for example, a silicon nitride wafer. Alternatively, the second component can be a quartz glass. The connecting element 3 of FIG. 2A shows a layer sequence which comprises a layer made of a first metal Me1, a layer made of a fourth metal Me4, a layer made of a second metal Me2 and a layer made of a third metal Me3. In particular, this layer sequence is applied on both sides, that is to say on the first and second components 1, 2. After being exposed to the influence of temperature, at least after method step C) and/or D), the individual layers of the individual metals convert into first and second phases 31, 32. Alternatively, a plurality of first phases 31 and a plurality of second phases 32 can also be used, in particular a plurality of first phases which are separated spatially by a second phase 32. In other words, the layers are at least partially or completely converted from the fourth, second and third metals and the layer of the first metal into the first and/or second phase 31, 32. The first and/or second phase 31, 32 comprises at least the four metals Me1, Me2, Me3 and Me4.

The device 100 of FIG. 2B additionally shows that the layer of the first metal Me1, i.e., in particular the adhesive layer 4 and/or the diffusion barrier 5, is not completely converted into the first and/or second phases 31, 32. In other words, the adhesive layer 4 remains in the form of a layer after the influence of method steps C) and D). Only the layer thickness of the first metal layer Me1 in the device 100 of FIG. 2B is reduced in comparison to that of the device 100 of FIG. 2A. In particular, the layer thickness of the adhesive layer 4 of the device 100 of FIG. 2B has a value which corresponds to one third of the layer thickness of the metal layer Me1 of the device 100 of FIG. 2A.

In other words, after completion of the solidification reaction of the solder and after formation of an adhesive intermediate layer of the adhesive layer 4, for example, nickel silicide, at least one third of the initial thickness thereof can be present in order to maintain the blocking effect. The required residual layer thickness of the multifunctional layer is, however, highly dependent on the used soldering system, the thickness thereof and the used type of multifunctional layer, that is to say the material used and its intrinsic properties, such as grain structure and stress.

The result is a device 100 of FIG. 2B at least after method step C) or D). The device 100 of FIG. 2B has a layer sequence of first component 1, adhesive layer 4, first phase 31, second phase 32, first phase 31, further adhesive layer 4 and second component 2.

Figure 3A:
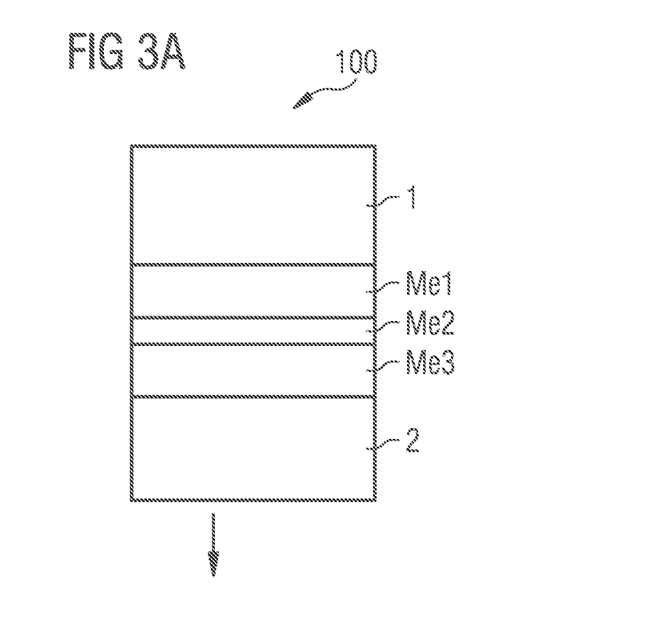
FIGS. 3A to 3B show schematic side views of a device according to an embodiment.
Figure 3B:
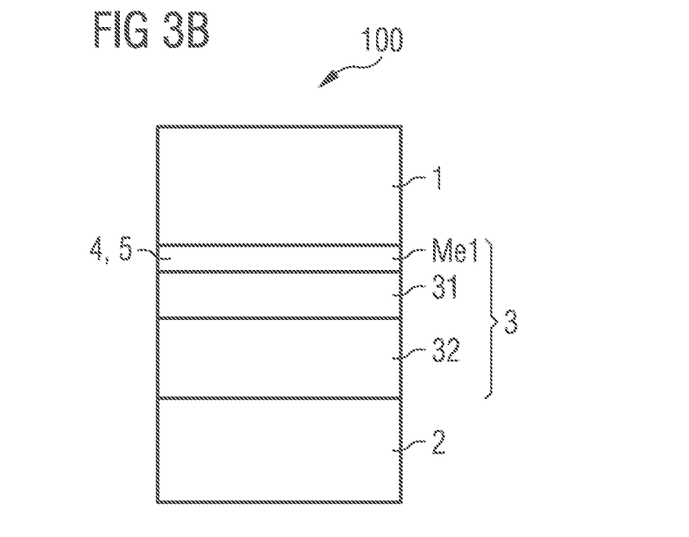

FIGS. 3A and 3B each show a schematic side view of a device according to an embodiment and the production thereof. The device of FIG. 3A shows a first and second component 1, 2, between which a layer sequence comprising a layer made of a first metal Me1, a layer made of a second metal Me2 and a layer made of a third metal Me3 is applied. The effect of temperatures results in a device 100 of FIG. 3B, wherein the connecting element 3 has an adhesive layer 4 and two phases, a first phase 31 and a second phase 32. The concentration of the first metal in the adhesive layer 4 is greater than the concentration c11 of the first metal in the first phase 31 and greater than the concentration c25 of the first metal in the second phase 32. In other words, the concentration decreases in the direction from the first components 1 to the second component 2 in the device 100 of FIG. 3B. The device 100 of FIG. 3B differs from the device of FIG. 2B in that the connecting element 3 has, in addition to the adhesive layer 4, only two phases, a first phase 31 and a second phase 32. In particular, the structure of the connecting element 3 of FIG. 3B is asymmetrical in comparison to the device 100 of FIG. 2B. The non-reacted layer of Me1 arranged between the adhesive layer 4 and the first phase 31 serves as a diffusion barrier 5.

Figure 4A:
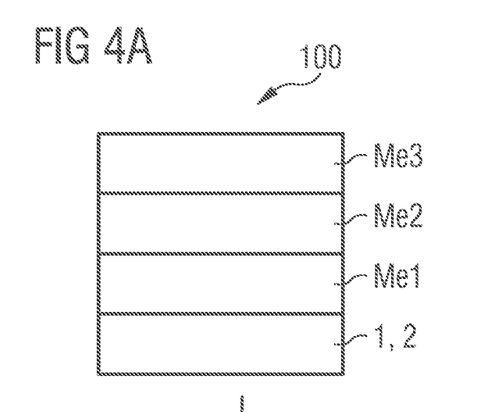
FIGS. 4A to 4B show schematic side views of a device according to an embodiment.
Figure 4B:
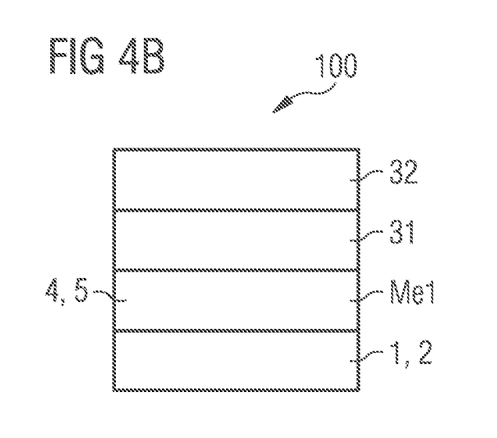

FIGS. 4A and 4B each show a schematic side view of a device according to an embodiment and the production thereof. FIG. 4A shows a device 100 having a first or second component 1, 2. A layer made of a first metal Me1 can be applied to the first or second component 1, 2. A layer made of a second metal Me2 can be arranged downstream of the layer Me1. A layer made of a third metal Me3 can be arranged downstream of the layer made of a second metal Me2. After the influence of temperatures, a device 100 of FIG. 4B is formed. In particular, a device having an adhesive layer 4 is formed. The adhesive layer 4 is directly arranged on the first or second component 1, 2. A first phase 31 and a second phase 32 are arranged downstream of the adhesive layer 4.

Figure 5A:
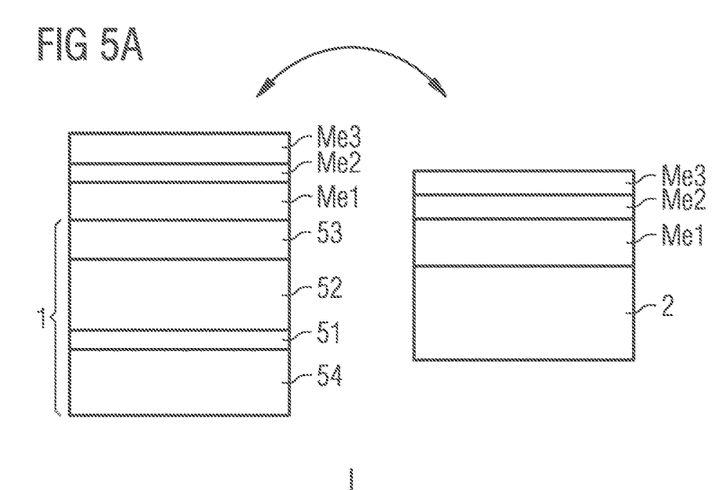
FIGS. 5A to 5B show a method for producing a device according to an embodiment.
Figure 5B:
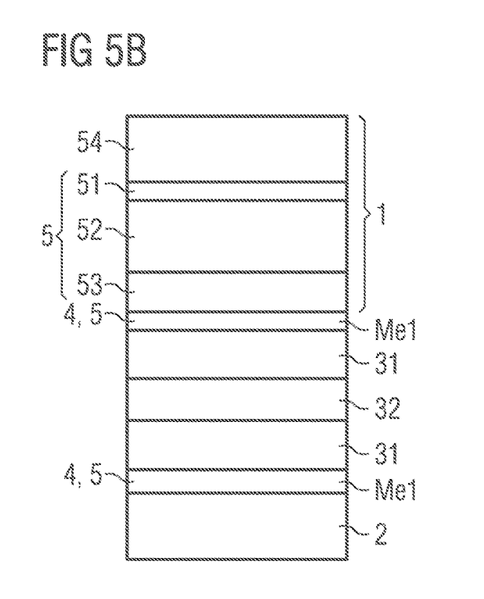

FIGS. 5A and 5B show a method for producing a device according to an embodiment. FIG. 5A shows the provision of a first component 1 and a second component 2. A layer of a first metal Me1 having a layer thickness d1 is applied on the first component 1, which comprises, for example, a layer sequence comprising a substrate 54, a p-type semiconductor layer 53, an n-type semiconductor layer 51 and an active layer 52. Alternatively, in this case and in the following, the n-type semiconductor layer 51 and the p-type semiconductor layer 53 can be interchanged. The layers were produced in particular using the thin-film method. Further layers of a second metal Me2 and a third metal Me3 are arranged downstream of the layer made of a first metal Me1. A layer of a first metal Me1 having a layer thickness d1, subsequently a layer of a second metal Me2 and subsequently a layer made of a third metal Me3 can be applied to the surface on the side of the second component 2. Subsequently, both components can be connected and a first temperature can be applied, in particular a temperature between 130 and 200° C., in order to form a first phase 31 and a second phase 32. In this case, the layers of the second and third metals Me2, Me3 can transform into the liquid aggregate state and react with the layers of the first metal Me1. The invention relates to a device 100 which comprises a first phase 31, a second phase 32 and a first phase 31 as a layer sequence of the connecting element 3. In addition, adhesive layers 4 made of the first metal Me1 are arranged on both sides of the first component 1 and the second component 2.

FIG. 5B shows that the first layer Me1 after method step C) or D) has not completely reacted with the second metal Me2 and/or third metal Me3 and optionally with the fourth metal Me4. A "residual layer" of the first metal Me1 remains, which forms the adhesive layer 4 and optionally the diffusion barrier with a layer thickness d2.

The system can react and form a thermodynamically and mechanically stable first and second phase 31, 32 by increasing the temperature, for example, to the second temperature between 230° C. and 400° C. A device is produced after step D) which has an adhesive layer 4 with a layer thickness d2<d1, wherein the layer thickness d2 of the adhesive layer 4 produced after step D) is resistant to diffusion and diffusion-tight with respect to other species. In particular, the adhesive layer 4 has a layer thickness of one third of the layer thickness of the original layer of the first metal Me1 of the device 100 of FIG. 5A. In particular, the layer Me1 is still present after tempering and serves as a diffusion barrier.

If two components 1, 2, for example, two wafers, are connected to one another, wherein one component has a functional layer, this can be carried out as follows.

A layer of a first metal Me1 having a layer thickness of 425 nm can be deposited as a functional layer. Subsequently, a layer of a second metal Me2, for example, indium, with a layer thickness of 150 nm can be applied to this layer, and a layer of a third metal Me3, for example, tin, with a layer thickness of 225 nm can be applied. On the other component, the same materials can be applied in the same order and thicknesses. The two components can be connected at 142° C. Alternatively or additionally, a uniaxial pressure of, for example, 1 MPa can be used. The components 1, 2 can be heated, in particular at a heating rate of 10 K/min proceeding from room temperature. The pressure can subsequently be applied, in particular the pressure can be maintained for 120 seconds. Cooling to room temperature can likewise take place at a rate of 10 K/min. Subsequently, the device or the arrangement can be exposed to a second temperature, so that the first and second phases 31, 32 are formed in the corresponding concentrations and is thus rendered mechanically and thermally stable. In particular, the arrangement is heated to a second temperature of between 230° C. and 400° C., forming a thermodynamically and mechanically stable first and second phase 31, 32. In particular, the tempering is carried out for 120 min. In this case, a first and a second phase 31, 32 are produced as well as a sufficiently thick adhesive layer 4 made of the first metal Me1, which can take over the function of the adhesion and barrier. In addition, the first metal Me1 can be part of the first and/or second phase 31, 32.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A device comprising:
a first component;
a second component; and
a connecting element directly arranged between the first component and the second component,
wherein the connecting element comprises at least a first metal, which is formed as an adhesive layer, a diffusion barrier and a component of a first phase and a second phase of the connecting element,
wherein the adhesive layer is arranged on the first component and/or the second component,
wherein the first phase and/or the second phase comprises, besides the first metal, further metals different from the first metal,
wherein a concentration of the first metal in the first phase is greater than a concentration of the first metal in the second phase, and
wherein the connecting element comprises a layer of a silicide of the first metal, which is arranged between the adhesive layer and the first component and/or the second component.

2. The device according to claim 1, wherein the first metal is selected from a group consisting of nickel, platinum and palladium, and/or wherein a concentration of the first metal in the diffusion barrier is greater than the concentration of the first metal in the first phase.

3. The device according to claim 1, wherein the first phase and/or the second phase are in each case shaped as layers, wherein the adhesive layer has a layer thickness d2, which is smaller, at least by a factor of 2, than the sum of the layer thicknesses of the first phase and/or the second phase.

4. The device according to claim 1, wherein no further adhesive layers other than the adhesive layer of the first metal and/or no further diffusion barriers other than the diffusion barrier of the first metal are arranged between the first and second components.

5. The device according to claim 1, wherein the connecting element is free of the following elements: titanium, tantalum, tungsten and/or nitrogen.

6. The device according to claim 1, wherein the further metals comprise at least a second metal and/or a third metal, and wherein the second metal is indium and the third metal is tin.

7. The device according to claim 1, wherein the further metals comprise at least a fourth metal, and wherein the fourth metal is gold.

8. The device according to claim 1, wherein the concentration of the first metal in the first phase is between 40 and 65 atom %, and/or wherein the concentration of the first metal in the second phase is between 20 and 40 atom %.

9. The device according to claim 1, wherein the concentration of the first metal in the first phase is between 11 and 25 atom %, and/or the concentration of the first metal in the second phase is 0 atom %.

10. The device according to claim 1, wherein a concentration of the second metal in the first phase is between 5 and 25 atom %, and/or wherein a concentration of the second metal in the second phase is between 20 and 40 atom %.

11. The device according to claim 1, wherein a concentration of the second metal in the first phase is between 0 and 23 atom %, and/or a concentration of the second metal in the second phase is between 13 and 29 atom %.

12. The device according to claim 1, wherein a concentration of a third metal in the first phase is between 15 and 40 atom %, and/or wherein a concentration of the third metal in the second phase is between 30 and 50 atom %.

13. The device according to claim 1, wherein a concentration of a third metal in the first phase is between 41 and 50 atom %, and/or wherein a concentration of the third metal in the second phase is between 0 and 10 atom %.

14. The device according to claim 1, wherein a concentration of a fourth metal Me4 in the first phase and/or the second phase is between 0 and 5 atom %, and/or wherein the concentration of the fourth metal in the first phase is between 28 and 40 atom %, and/or a concentration of the fourth metal in the second phase is between 71 and 83 atom %.

15. A method for producing the device according to claim 1, the method comprising:
providing the first component and the second component;
applying at least one adhesive layer made of the first metal with a layer thickness d1 on the first component and/or the second component;
applying at least one layer of a second metal and at least one layer of a third metal on the adhesive layer thereby forming an arrangement, wherein the first, second and third metals are different from each other;
heating the arrangement to a first temperature between 130° C. and 260° C. for forming of the first phase and the second phase, wherein the first and second phases comprise the first metal of the adhesive layer, the second metal and the third metal; and
thereafter, heating the arrangement to a second temperature between 230° C. and 400° C. to form a thermodynamically and mechanically stable first and second phase,
wherein, at least before heating the arrangement to the second temperature, the first and second components are connected to each other,
wherein, after heating the arrangement to the second temperature, the device comprises an adhesive layer with a layer thickness d2<d1, the adhesive layer being adhesive and in a diffusion-tight manner, and
wherein the adhesive layer is arranged between the first phase and the first component and/or the second component.

16. The method according to claim 15, further comprising applying a layer of a fourth metal, which is a component of the first phase and/or the second phase, wherein the adhesive layer with the layer thickness d2, the first phase and the second phase are arranged between the first component and/or the second component of the device.

* * * * *